(12) United States Patent
Cvetkovic et al.

(10) Patent No.: US 6,331,831 B1
(45) Date of Patent: Dec. 18, 2001

(54) A/D CONVERSION THROUGH DITHERING

(75) Inventors: Zoran Cvetkovic, Summit; Ingrid Daubechies, Princeton, both of NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/684,181

(22) Filed: Oct. 7, 2000

Related U.S. Application Data

(60) Provisional application No. 60/165,268, filed on Nov. 12, 1999.

(51) Int. Cl.⁷ .................................... H03M 1/20
(52) U.S. Cl. .............................. 341/131; 341/155
(58) Field of Search .................. 341/131, 155, 341/120, 118, 144

(56) References Cited

U.S. PATENT DOCUMENTS 6,049,299 * 4/2000 Lunacek ................ 341/131
6,268,814 * 7/2001 Kolsrud ................. 341/131

OTHER PUBLICATIONS

Cvetikovic et al, Single–Bit Oversamples A/D Conversion With Exponential Accuracy in the Bit–Rate, Data Compression Conference, DCC 2000, Snow Bird, UT, Mar. 2000, pp. 343–352.

* cited by examiner

*Primary Examiner*—Brian Young
(74) *Attorney, Agent, or Firm*—Henry T. Brendzel

(57) ABSTRACT

A/D conversion is achieved by employing a piecewise continuous dither signal such that a signal that results from combining the dither signal with the signal to be converted, has a zero-crossing within each interval $I_j=(jT,(j+1)T)$, where j is an integer, $T=\pi/\lambda B$, B is the bandwidth of the signal to be converted, and $\lambda$ is a constant that is greater than 1, and those zero crossings in adjacent intervals $I_j$ are always separated by some minimal distance, $\epsilon$, for all intervals $I_j$. Zero crossings of the combined signal are detected, and the instances where those crossings occur are encoded; one zero crossing for each interval.

18 Claims, 3 Drawing Sheets

A/D CONVERSION THROUGH DITHERING

CLAIM OF PRIORITY

This application claims priority from a provisional application No. 60/165,268, which was filed Nov. 12, 1999.

BACKGROUND

This invention relates to Analog to Digital (A/D) conversion.

A/D conversion involves converting a time-continuous and amplitude-continuous signal into a sequence of time-discrete and amplitude-discrete samples and encoding those samples. Conventionally, the signal is sampled in time with a sampling clock having frequency $1/\tau$, and uniformly quantized in amplitude with step size q. The accuracy of the conversion depends, of course, both on the resolution in time and the resolution in amplitude. For most practical applications, the signal to be converted is band-limited, and the sampling frequency is at or above the Nyquist rate. Therefore, the time discretization is reversible. The amplitude discretization, however, introduces an irreversible loss of information. This is typically referred to as quantization error.

The prior art has shown that the expected quantization error is $$E(|s(t) - s_T(t)|^2) = \frac{1}{12} q^2 \frac{\tau}{\tau_N} \quad (1)$$

where s(t) is the time and amplitude-continuous input signal, $S_T(t)$ is a time and amplitude-continuous signal developed from the time discrete and amplitude discrete signal, $\tau$ is the actual sampling interval, and $\tau_N$ is the Nyquist sampling interval.

The $\frac{\tau}{\tau_N}$ quotient in equation (1) suggests that the conversion accuracy can be improved beyond the precision of the quantizer by introducing oversampling. Because the costs involved in building high-precision amplitude quantizers are relatively high, modern techniques for high accuracy A/D conversion are based on oversampling. Apart from this economical and technological consideration, however, using oversampling to improve the conversion accuracy is dramatically inferior, in rate-distortion sense, to refining quantization. For a given precision of the quantizer, unless some entropy coding is used, the bit-rate of oversampled A/D conversion is inversely proportional to the sampling interval, $R=O(1/\tau)$; hence, the mean squared error decays only inversely to the bit-rate, $E(|s(t)-S_T(t)|^2)=O(1/R)$.

Only recently has it been demonstrated that the accuracy of oversampled A/D conversion is better than suggested by equation (1), and that even without entropy encoding the quantized samples can be efficiently represented so that an exponentially decaying rate-distortion characteristic can be attained. A deterministic analysis shows that if the quantization threshold crossings of a signal s(t) form a sequence of stable sampling for the space of square intergrable bandlimited signals to which s(t) belongs, and $s_T(t)$ is a square intergrable function, in that same bandlimited space, for which the oversampled A/D conversion produces the same digital sequence as for s(t), then the squared error between s(t) and $s_r(t)$ can be bounded as $$|s(t) - s_T(t)|^2 < c_s \left(\frac{\tau}{\tau_N}\right)^2 \quad (2)$$

uniformly in time. Moreover, representing the information about the quantization threshold crossings requires only a logarithmic increase of the bit-rate as the sampling interval tends to zero. Hence using this quantization threshold crossings based representation the rate distortion characteristic of oversampled A/D conversion becomes $$|S(t)-S_T(t)|^2 < a_s e^{-\alpha R} \quad (3)$$

Where $\alpha$ is a positive constant, and $\alpha_s$ is proportional to the factor $c_s$ in equation (2).

While these results provide a radically new perspective on oversampled A/D conversion, some important issues remained unanswered. The $\tau^2$ conversion accuracy is established under the assumption that the quantization threshold crossings of the input signal constitute a sequence of stable sampling in an appropriate class of bandlimited signals. Although there are bandlimited signals which have this property, there also exist bandlimited signals for which the threshold crossings are too sparse to ensure this conversion accuracy; giving a precise characterization of these two classes of bandlimited signals is very intricate. Another problem is that the stronger error bound in equation (2) is not uniform on sufficiently general compact sets for simple oversampled A/D conversion in its standard form. Note also that the result about $O(\tau)$ accuracy with the linear reconstruction is valid only in a small range of discretization parameters q and $\tau$, and that the error does not tend to zero along with the sampling interval but rather reaches a floor level for some finite $\tau$. So, there are basically no sufficiently general results about the accuracy of simple oversampled A/D conversion. Moreover, no explicit algorithms for reconstructing a bandlimited signal with $\tau^2$ accuracy are known, and the feasibility of local reconstruction with this accuracy is not clear.

SUMMARY OF THE INVENTION

An advance in the art is achieved with an A/D conversion scheme that employs a dither signal. Specifically, the signal to be converted is augmented with a deterministic, piecewise continuous, dither signal such that, a signal that results from combining the dither signal with the signal to be converted, has a zero-crossing within each interval $I_j=(jT,(j+1)T)$, where j is an integer, $T=\pi/\lambda B$, B is the bandwidth of the signal to be converted, and $\lambda$ is a constant that is greater than 1, and those zero crossings in adjacent intervals $I_j$ are always separated by some minimal distance, $\epsilon$, for all intervals $I_j$. Zero crossings of the combined signal are detected, and the instances where those crossings occur are encoded; one zero crossing for each interval.

BRIEF DESCRIPTION

FIG. 1 shows an illustrative input signal s(t) and an illustrative dither signal d(t);

FIG. 2 presents a block diagram of one A/D converter embodiment that comports with the principles disclosed herein;

Figure 5:
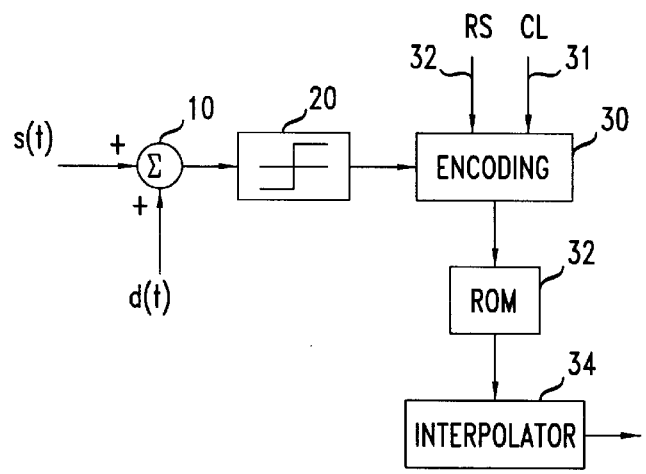
Figure 6:
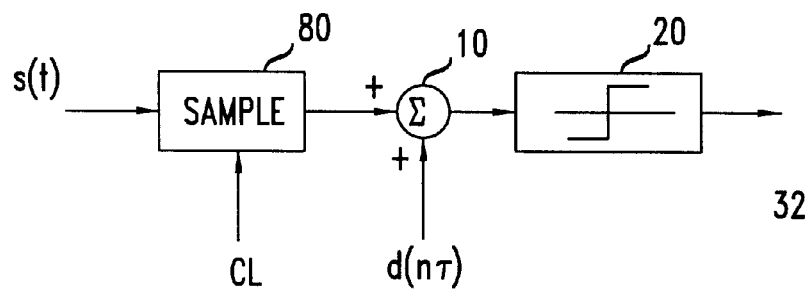
Figure 7:
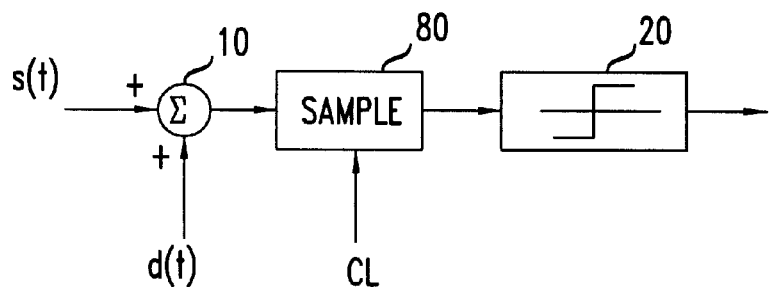
Figure 8:
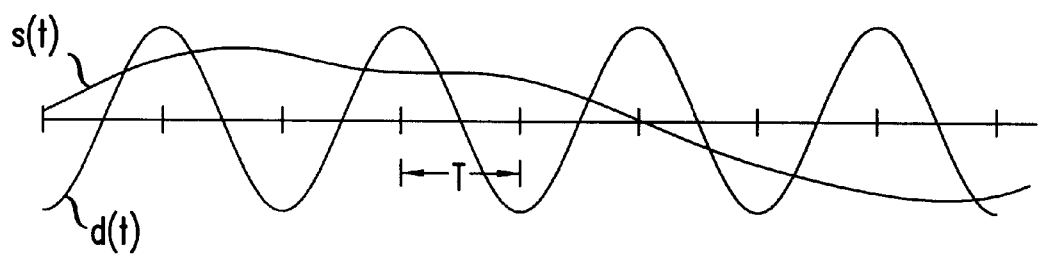

FIG. 5 presents a block diagram of a modified A/D converter that obviates the need to interpolate within the D/A converter;

FIG. 6 is a block diagram of a different A/D embodiment that comports with the principles disclosed herein;

FIG. 7 present still another embodiment of an A/D converter that comports with the principles disclosed herein; and FIG. 8 illustrates a different dither signal.

DETAILED DESCRIPTION

Figure 1:
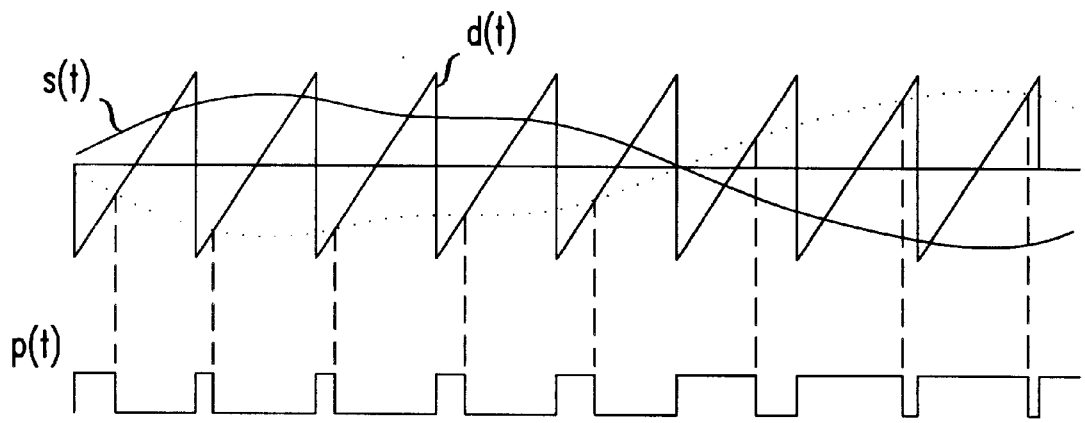

In FIG. 1, input signal s(t) is a bandlimited signal with an upper frequency B. Its peak amplitude is limited to ±C, where C>0. The dither signal d(t) is a signal that extends between +(C+Δ) and −(C+Δ), where Δ>0 and has a fundamental frequency f=λA B, where λ>1. Illustratively, the dither signal in FIG. 1 is a sawtooth signal, but other piecewise continuous signals are also acceptable.

Figure 2:
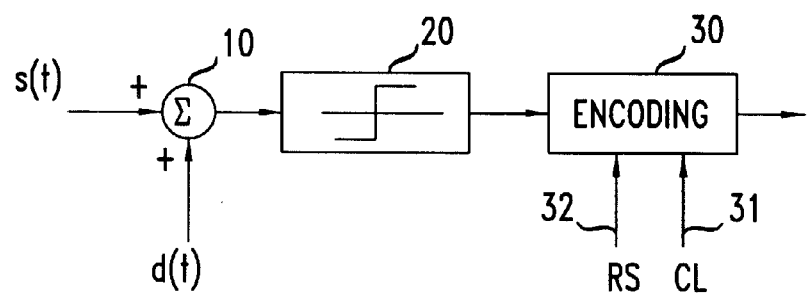

In FIG. 2, signals s(t) and d(t) are summed in adder 10 and applied to zero crossing detector 20, which develops a pulse output signal p(t). The action of elements 10 and 20 that develop the output signal p(t) is illustrated in FIG. 1 by showing the zero crossings occurring at the intersection of signals -s(t) and d(t). The information about s(t) is contained in the widths of the p(t) pulses and, accordingly, the output of detector 20 is applied to encoder circuit 30 that converts the widths of the pulses in p(t) to a digital signal in the range 0 to $2^N-1$, where N is a chosen integer that relates to the desired sampling interval τ, that is, by $\tau=T/2^N$, where T=π/λB. Encoder circuit 30 is realized, for example, with an up-counter that counts periods of clock CL (31), which effectively is a sampling clock having the frequency 1/τ, and is reset by signal RS (32) at the beginning of each period of the signal d(t). Circuit 30 thus develops a digital value at the average rate of λB.

Figure 3:
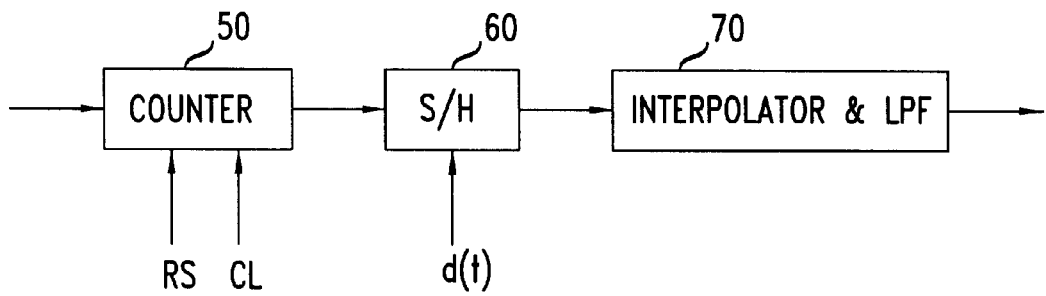
FIG. 3 is a block diagram of a D/A converter that decodes the signal developed by the A/D converters depicted in previous FIGS.

FIG. 3 presents a D/A circuit that is responsive to the signal developed by the FIG. 1 circuit. Digital words, which are received at the rate λB, are entered into a down-counter 50 in synchronism with signal d(t) (i.e., by operation of clock RS). Counter 50 is driven by clock CL and outputs a signal when it reaches 0. That signal triggers a sample-and-hold circuit 60 that is fed by the dither signal d(t). Circuits 50 and 60 can be replaced by a read-only-memory (ROM) that converts the digital input signal to amplitude signals that approximate the height of the signal s(t) at the time instances when circuit 20 detected the zero crossings.

Figure 4:
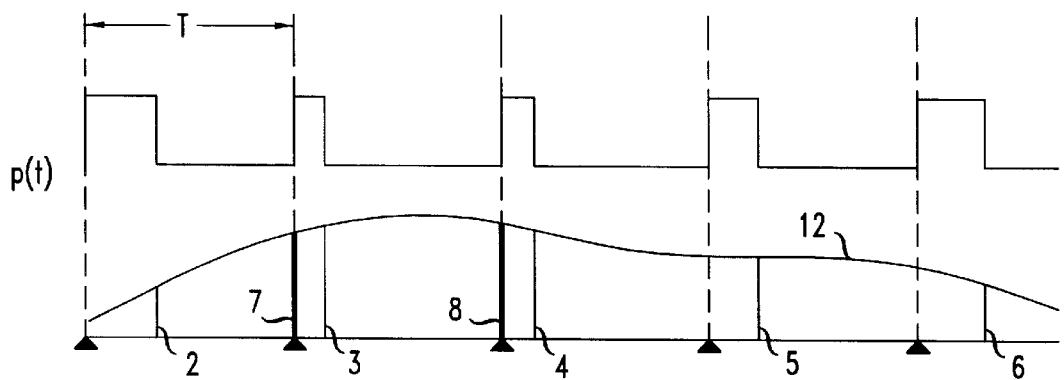
FIG. 4 illustrates the interpolation that is necessary in a D/A converter that is responsive to signals generated by the FIG. 2 A/D converter.

FIG. 4 shows the samples developed by circuit 60 in response to the first five digital values (samples 2, 3, 4, 5, 6 in FIG. 4) that are developed by circuit 30 and communicated to circuit 50. As can be observed, these samples correspond to the values of s(t) at the zero crossing instances of the signal applied to circuit 20. Although there is one of these samples in each T interval, they do not occur at the same time relative to the beginning of those T intervals. In other words, they are irregularly spaced in time. From these irregularly spaced samples one can interpolate a regular sequence of samples at the rate 1T, using any standard function interpolation scheme; e.g., Lagrangian interpolation. Effectively, a curve 12 is created from samples 2 through 6, which allows creating the regular sequence of samples, for example, samples 7 and 8. Once an interpolated sequence of samples is developed, it can be applied to a low pass filter to recover the best approximation to s(t).

FIG. 5 presents a block diagram of an A/D converter that shifts the interpolation carried out in the D/A converter of FIG. 4 to the A/D converter, permitting use of a D/A converter without an interpolator. Basically, FIG. 5 includes the elements of FIG. 3, followed by ROM 32, and interpolator 34. ROM 32 converts the pulse width computation of element 30 to a sample height of the signal s(t) at the time of the zero crossings (based, obviously, on d(t)), and interpolator 34 performs the interpolations described above.

FIG. 6 presents a different embodiment of an A/D converter in conformance with the principles disclosed herein (that corresponds to the FIG. 2 A/D converter). The input signal s(t) is applied to sampling circuit 80, which is sampled with the sampling clock CL (having the frequency 1/τ), and the sampled output of circuit 80 is added to a sequence of samples that represent the dither signal d(t) in adder 10. This signal may be obtained from a ROM (not shown) in a conventional manner. The output of adder 10 is applied to zero crossing detector circuit 20, and the output of circuit 20 is p(nτ) which comprises intervals of length T, and each interval begins with a string of 1's followed by a string of 0's, or vice versa. The output of circuit 20 is applied to encoder 22, which encodes the location of data change within each interval.

FIG. 7 presents still another embodiment of an A/D converter in conformance with the principles disclosed herein (that corresponds to the FIG. 2 A/D converter). It differs from the FIG. 6 embodiment only in that the dither signal is analog, rather than sampled and, therefore, the addition of d(t) to s(t) precedes sampling circuit 80.

As indicated above, the dither signal depicted in FIG. 1 is merely illustrative, and many other different dither signals can be used. To illustrate, FIG. 8 depicts a situation where the dither signal d(t) is a −cos(πt/T). It may also be noted that the two input signals to the FIG. 2 circuit can be time-discrete signal (i.e., sampled versions of the input signal and the dither signal). As an aside, it is noted that the more mathematical aspects of the invention are published in "Single-Bit Oversampled A/D Conversion with Exponential Accuracy in the Bit-Rate," by Cvetkovic and Daubechies, in the proceedings of the Data Compression Conference, DCC 200, Snow Bird Utah, March 2000, pp. 33–352. This publication is hereby incorporated by reference herein.

What is claimed is:

1. Apparatus for converting an input signal to digital form, where the input signal corresponds to an information signal that is bandlimited to frequency B, an amplitude range of ±C, comprising:

a dither signal that has a zero crossing within each interval T, where T=π/λB, λ is a constant that is greater than 1 and spans in amplitude a range that is greater than the amplitude range of said input signal;

a circuit that determines zero crossings of a signal that combines said input signal and said dither signal; and an encoder, responsive to said circuit, that encodes position of a zero crossing within each of said intervals.

2. The apparatus of claim 1 where said dither signal is piecewise continuous.

3. The apparatus of claim 1 where said dither signal is periodic, with period T.

4. The apparatus of claim 1 where said dither signal progresses from −(C+Δ) to +(C+Δ), where Δ is a positive constant.

5. The apparatus of claim 4 where said dither signal is sinusoidal.

6. The apparatus of claim 4 where said dither signal is linear within each interval.

7. The apparatus of claim 1 where said signal that combines said input signal and said dither signal is a sum of said input signal and said dither signal.

8. The apparatus of claim 1 where said circuit comprises:

an adder responsive to said input signal and to said dither signal, and a zero-crossing detector responsive to said adder.

9. The apparatus of claim 8 where said dither signal is a time-sampled dither signal, said input signal is a time-sampled facsimile of said information signal, said time-sampled dither signal and said input signal being sampled at a selected frequency.

10. The apparatus of claim 8 where said encoder is further responsive to a sampling clock.

11. The apparatus of claim 10 where said encoder comprises a counter that is driven by said sampling clock, which counter begins counting periods of said sampling clock at a beginning of each interval, and stops said counting in response to a signal from said zero-detector that indicates a zero crossing.

12. The apparatus of claim 1 where said dither signal is a sampled dither signal, and said circuit comprises:

a sampling circuit responsive to said input signal and to a sampling clock at a frequency equal to sampling frequency of said sampled signal;

an adder responsive to output signal of said sampling signal and to said sampled dither signal; and a zero-crossing detector responsive to said adder.

13. The apparatus of claim 12 where said sampling frequency is at least $2^N/T$, where N is a selected constant.

14. The apparatus of claim 1 where said circuit comprises:

an adder responsive to said input signal and to said dither signal;

a sampling circuit responsive to said adder and to a sampling clock; and a zero-crossing detector responsive to said sampling circuit.

15. The apparatus of claim 1 further comprising an interpolator responsive to said encoder that converts each position of zero crossing to an amplitude of said input signal at time of said zero crossing, and develops therefrom an amplitude of said input signal at a preselected time within said interval.

16. The apparatus of claim 15 where said preselected time is at beginning of said interval.

17. Apparatus responsive to a sequence of digital signals, each of which represents a time within an interval when a zero crossing occurs, comprising a circuit for converting each digital signal that represents a time, to a digital signal that represents an amplitude of an information signal at said time within an interval when a zero crossing occurs;

an interpolator responsive to the digital signals that represent an amplitude, which are developed by said circuit; and a low pass filter responsive to said interpolator.

18. The apparatus of claim 17 where said interpolator develops a sequence of amplitude signals that approximate signals of said information signal that are sampled at regular intervals.

* * * * *